(12) United States Patent
Kucharski

(10) Patent No.: US 7,154,923 B2
(45) Date of Patent: Dec. 26, 2006

(54) METHOD AND APPARATUS FOR PROVIDING A MODULATION CURRENT

(75) Inventor: Daniel Kucharski, Webster, NY (US)

(73) Assignee: International Business Machines Corporation, Armonk, NY (US)

(*) Notice: Subject to any disclaimer, the term of this patent is extended or adjusted under 35 U.S.C. 154(b) by 137 days.

(21) Appl. No.: 10/925,318

(22) Filed: Aug. 24, 2004

(65) Prior Publication Data

US 2006/0044072 A1    Mar. 2, 2006

(51) Int. Cl.
*H01S 3/13* (2006.01)
*H01S 3/10* (2006.01)
*H03K 3/00* (2006.01)

(52) U.S. Cl. .............. 372/29.015; 372/29.011; 327/108; 327/109; 332/106; 332/107

(58) Field of Classification Search ........... 327/108, 327/109; 332/106, 107; 372/9, 29.01, 29.011, 372/29.015

See application file for complete search history.

(56) References Cited

U.S. PATENT DOCUMENTS

| 6,373,346 B1 | 4/2002 | Kobayashi |
| 6,389,050 B1 | 5/2002 | Stronczer |
| 6,891,866 B1* | 5/2005 | Robinson et al. ........ 372/29.15 |

* cited by examiner

*Primary Examiner*—David Mis
(74) *Attorney, Agent, or Firm*—Ryan, Mason & Lewis, LLP

(57) ABSTRACT

Techniques are disclosed for providing modulation current that includes output impedance compensation with a feed-forward bandwidth enhancement and pre-distortion modulation to control waveform transition symmetry. A feedback circuit senses output node voltage and increases the overdrive voltage of a current source. This offsets the loss of current due to channel length modulation and increases the effective output impedance of the source. A feed-forward circuit enhances the bandwidth of the impedance compensation feedback loop. Waveform transition symmetry is improved by pre-distorting a laser modulation current by introducing an undershoot current on the falling edge of the modulating current.

44 Claims, 9 Drawing Sheets

ACTIVE CURRENT SOURCE
500

ACTIVE CURRENT MIRROR (5Gb/s)
600

METHOD AND APPARATUS FOR PROVIDING A MODULATION CURRENT

FIELD OF THE INVENTION

This invention relates generally to a method and apparatus for providing a modulation current and, more particularly, this invention relates to providing a modulation current that is a function of feedback, feed-forward bandwidth enhancement and/or waveform shaping.

BACKGROUND OF THE INVENTION

High speed semiconductor applications require accurate control over output impedance of a circuit. Voltage outputs typically require an output impedance that is matched to an electrical transmission line and a load that the circuit is driving. Current outputs typically require a high output impedance to consistently operate with a variety of loads. In the latter case, advances in CMOS (complementary metal-oxide-semiconductor) technologies make achieving high output impedances more difficult because of the short-channel effects in transistors, such as channel length modulation. In CMOS technology, transistors are used to realize logic functions, and in high speed and current mode circuits, FETs (field effect transistors) are used as current sources. In addition, scaling of the power supply voltages sometimes precludes stacking of multiple transistors to achieve a higher output impedance such as in a cascode current source. Alternatively, active impedance regulation may be used, but such regulation has speed limitations due to the feedback control loop. Therefore, a designer using a conventional circuit topology has to reconcile conflicting considerations that include tradeoffs between speed and impedance.

Another performance consideration is the non-linear characteristics of a load, such as a laser, driven by a transconductance amplifier (TCA). In most cases, the bandwidth capability of a waveguide exceeds that of a laser. Thus, in order to minimize cost per unit of data, it is advantageous to modulate lasers at their maximum frequency. However, operating lasers near their maximum frequencies causes a variety of non-ideal transient behaviors that can cause inter-symbol interference (ISI), which unfortunately increases the error rate.

SUMMARY OF THE INVENTION

Principles of the present invention provide improved modulation current generation techniques.

In one aspect of the invention, a control signal is generated for a current source based on an input voltage differential, and an output current is modulated. Operation of a control node of the current source is preconditioned and the modulation current is provided to a load as a function of the current through the current source.

In another aspect of the invention, the modulation current waveform is shaped. This includes generating modulated output signals, as a function of input signals, in accordance with a modulating circuit, and sensing a transition in the waveform. A signal is generated to shape the waveform, and the waveform-shaping signal is provided to an output node via a variable tail current of the modulating circuit.

In a further aspect of the invention, feed-forward aspects and pre-distortion aspects may be combined. This involves providing a shaped waveform to a load by generating a control voltage based on a voltage differential and modulating an output current. Operation of a control node of a current source is preconditioned and a transition in a waveform is sensed. A signal to shape the waveform is generated and the shaped waveform is provided to a load.

A more complete understanding of the present invention, as well as further features and advantages of the present invention, will be obtained by reference to the following detailed description and drawings

DETAILED DESCRIPTION OF PREFERRED EMBODIMENTS

When designing MOSFET (metal oxide semiconductor field effect transistor) devices, it is advantageous to design them with minimum channel lengths, since this minimizes parasitic capacitance for a given bias current. However, short channel MOSFET devices are more susceptible to channel length modulation, a short-channel effect that can significantly reduce drain-to-source impedance of a MOSFET device in the saturation state, causing a single short-channel MOSFET to be a less-than ideal current source. This characteristic also affects most of the advanced BiCMOS (bipolar complementary metal oxide semiconductor) technologies including SiGe (silicon germanium). These characteristics are mitigated, in accordance with principles of the invention, by generating a modulation current via techniques that include output impedance compensation with feed-forward bandwidth enhancement.

Figure 1:
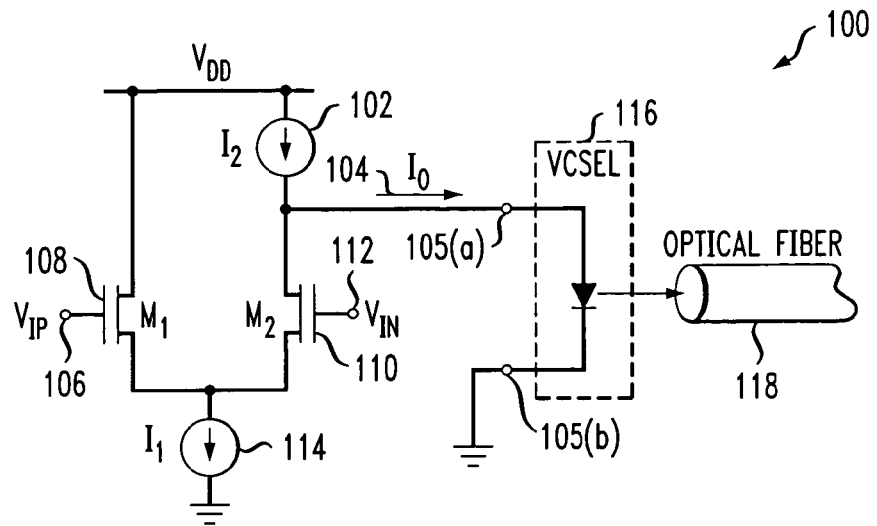
FIG. 1 shows a schematic diagram of a transconductance amplifier (TCA)-type laser diode driver (LDD)

FIG. 1 shows a schematic diagram of a transconductance amplifier (TCA)-type laser diode driver (LDD) 100. An LDD is an electronic circuit used to modulate the optical output of a device, such as a laser. The LDD 100 of FIG. 1 is shown as modulating current flowing through a semiconductor device, shown as a Vertical Cavity Surface Emitting Laser (VCSEL) device 116.

LDD 100 includes a constant current source 102, and a differential pair current switch (transistors 108 and 110) that can sink a portion of current 102, diverting it away from the semiconductor device 116. The current source 102 needs a relatively high output impedance to accommodate variations in series resistance of the semiconductor device 116 without significant signal loss.

Current 104 is an output current provided to VCSEL 116, which may be coupled to optical fiber 118. Nodes 105(*a*) and 105(*b*) (hereinafter, generally referred to as node 105) represent the package or chip boundary between the LDD and the optical device. Input voltage source ($V_{IP}$) 106 and input voltage source ($V_{IN}$) 112 provide positive and negative voltage phases, respectively, to transistors 108 and 110, respectively, and together constitute a differential input. Current source 114 provides a tail current for transistors 108 and 110.

I. Output Impedance Compensation with Feed-Forward Enhancement

Figure 2:
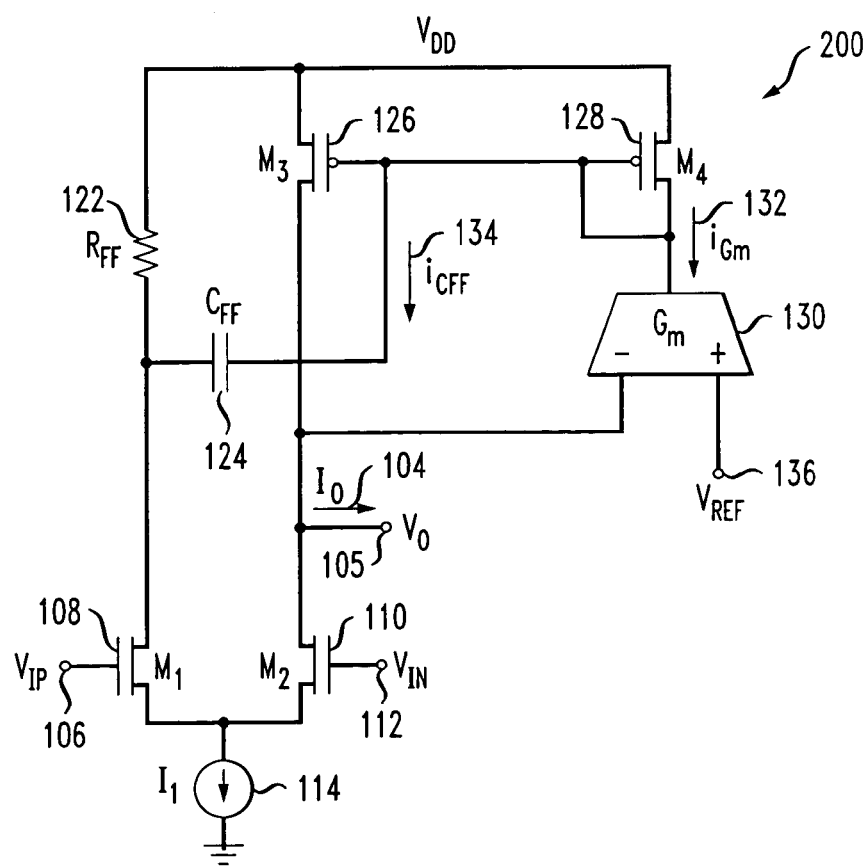
FIG. 2 shows a schematic diagram of a feed-forward circuit according to an embodiment of the present invention.

Output impedance compensation with a feed-forward enhancement, as disclosed herein, offsets the loss of current due to channel length modulation and thereby increases the effective output impedance of a current source. One exemplary circuit, which will be described in more detail with reference to FIG. 2, is a TCA (transconductance amplifier) architecture that uses a single, short-channel PFET (p-type field effect transistor) as a current source to conserve voltage headroom and to minimize the output node capacitance for high-speed operation. P-type transistors use holes as current carriers and N-type transistors use electrons as current carriers. N-type transistors are typically chosen for current switching due to their higher speed capability compared to P-type transistors in the same technology. An active impedance compensation circuit addresses the issue of channel length modulation by using a feedback circuit to sense the output node voltage and increase the overdrive voltage of the PFET transistor as its source-to-drain voltage drops. This offsets the loss of current due to channel length modulation and increases the effective output impedance of the current source. A feed-forward circuit enhances the bandwidth of the impedance compensation feedback loop, allowing the compensated laser driver to operate as fast as its uncompensated counterpart. The feedback features will be described first, followed by a description of the feed-forward features.

(i) Feedback Features

FIG. 2 shows a schematic diagram of a circuit 200 according to an embodiment of the present invention. Circuit 200 may operate as a laser diode driver circuit. Input voltage source ($V_{IP}$) 106 and input voltage source ($V_{IN}$) 112 provide positive and negative voltage phases, which together constitute a differential input. Current source 126, which is, for example, a PFET transistor, provides output current ($I_O$) 104 to output node 105. Output node 105 is typically coupled to a load, such as a laser (load not shown in FIG. 2). Part of the current source 126 drain current can be diverted through a modulation circuit, which is shown as transistor 110. Modulation circuit 110 is coupled to transistor 108, which together form a differential source-coupled pair. Laser modulation is accomplished by transistor 110 alternating between two output current levels. High logic level (e.g., "1") is transmitted if the current from current source 126 is forced into the output node 105. Low logic level (e.g., "0") is transmitted if the current from current source 126 is shunted through transistor 110. Thus the modulation function is performed by transistor 110. The difference between the two load current levels represents one bit of data. Loads that may be connected to output node 105 include, for example, a laser, a light emitting diode (LED), an electro-absorption modulating element and a resistive element. Tail current source 114 from transistors 110 and 108 is a fixed current that is used to control the amplitude of the modulation current switched by the modulating circuit 110.

An impedance compensation circuit consists of a transconductor 130, which compares the voltage, $V_O$, at the output node 105 to a reference voltage, $V_{REF}$, at reference node 136 and converts the voltage difference ($V_{REF}-V_O$) into a reference current for a current mirror consisting of transistors 126 and 128. As the voltage, $V_O$, at output node 105 increases, the transconductor 130 sinks more current ($i_{GM}$) 132. This current 132 is supplied through transistor 128, which pulls down the gate voltage of transistors 126 and 128.

Consequently, the overdrive voltage ($V_{GS}-V_T$) (where $V_{GS}$ is the gate-to-source voltage of transistor 126 and $V_T$ is the threshold voltage of transistor 126) of transistor 126, which is used as a current source, increases. Channel length modulation (represented by λ, also known as "Early effect") is a linear function of drain-to-source voltage, $V_{DS}$, as shown in Equation 1.

$$I_D = I_{Dsat}(1+\lambda V_{DS}) \qquad \text{(Eq. 1)}$$

A linear process can be compensated for using a linear element such as transconductor 130. By adjusting transconductance ($G_m$) and the reference voltage $V_{REF}$ at node 136, the increase in current source 126 overdrive can offset the loss of current due to decreasing drain-to-source voltage ($V_{DS}$). Thus, the effective output impedance, defined as $\Delta V_O/\Delta I_O$, can be increased or even made negative.

However, at data rates that approach the maximum frequency limit of a given semiconductor technology, the delay in the impedance compensation feedback loop can become relatively large. It is desirable for the feedback path to have a higher bandwidth than the signal path, and thus react almost instantaneously to signal changes. However, both the signal path and the feedback path are typically fabricated together in the same semiconductor technology and are consequently subjected to the same bandwidth limitations. Insufficient feedback path bandwidth can lead to instability, which can be observed as jitter, excessive ringing, or even oscillations. The instability increases inter-symbol interference (ISI) and also increases error rate. Consequently, most high-speed, wideband amplifiers that operate close to the frequency limits of a given technology use open loop architectures (where the term "open loop" signifies lack of signal feedback). An LDD with impedance compensation feedback may also reduce data rate to avoid ISI. However, increasing data throughput is usually the primary motivation for developing optical transceivers, and sacrificing maximum data rate in exchange for better impedance control may not be desirable.

(ii) Feed-forward Features

In order to avoid sacrificing maximum data rate in exchange for better impedance control, impedance compensation bandwidth can be enhanced with a feed-forward circuit that includes resistor $R_{FF}$ 122 and a capacitor $C_{FF}$ 124. Resistor $R_{FF}$ 122 loads the drain of transistor 108, converting transistor 108 drain current into voltage. During signal transitions, high frequency components of this voltage, shown as current $i_{CFF}$ 134, propagate through capacitor $C_{FF}$ 124 and are applied to gates of transistor 126 and transistor 128, initiating their charging and discharging before the transconductor 130 in the feedback loop has time to respond. The signal from the feed-forward circuit (resistor $R_{FF}$ 122 and a capacitor $C_{FF}$ 124) has the same polarity as the output of the transconductor 130, but with a much shorter delay. The high pass characteristics of the feed-forward circuit (resistor $R_{FF}$ 122 and a capacitor $C_{FF}$ 124, which essentially constitute a differentiator) allow its signal to fade as the transconductor 130 output starts to change, and the effective response time is significantly reduced. Thus, the feed-forward circuit acts to precondition the gates of transistors 126 and 128 when a signal transition takes place.

The feed-forward circuit (122, 124) is powered by the current flowing through transistor 108. This current is normally wasted, because the driver has a single-ended output taken from the drain of transistor 110. FIG. 2 enables the feed-forward circuit (122, 124) to take advantage of an existing signal (current flowing through transistor 108 which is equal in magnitude to the current flowing through transistor 110, but 180° out of phase), and therefore does not dissipate any additional power.

Figure 3:
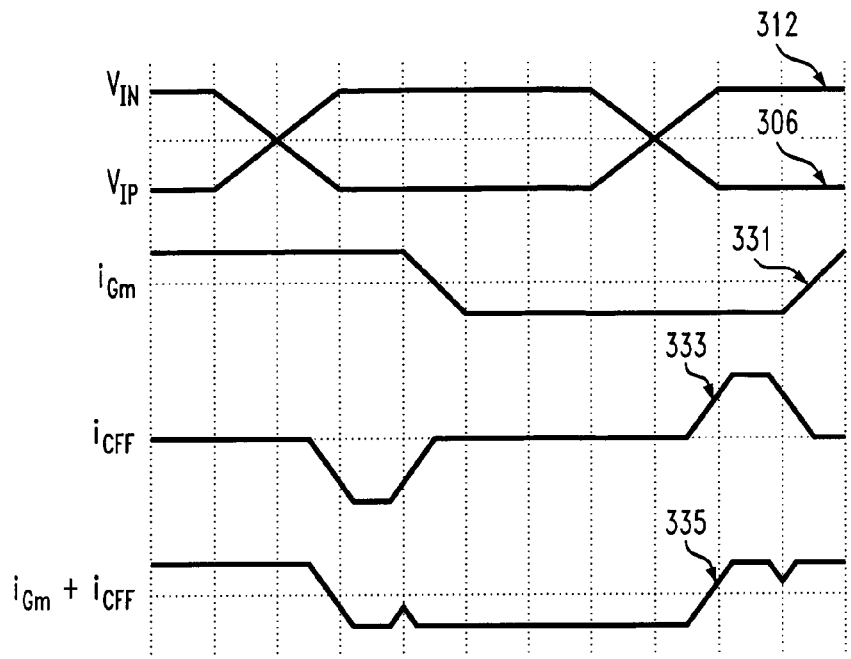
FIG. 3 illustrates examples of time domain waveforms of the LDD shown in FIG. 2.

FIG. 3 illustrates examples of time domain waveforms of the LDD shown in FIG. 2. The amplitude and the duration of the feed-forward pulse can be adjusted with resistor $R_{FF}$ (shown in FIG. 2 as element 122) and capacitor $C_{FF}$ (shown in FIG. 2 as element 124). If appropriate values are chosen, the feed-forward pulse will precede and blend with the feedback signal, which has an effect similar to increasing the feedback loop bandwidth. This is illustrated by waveforms 306, 312, 331, 333 and 335, in FIG. 3. As positive input voltage signals ($V_{IP}$), represented by line 306 change from "low" to "high," there is a delay before the transconductor current, represented by line 331 (shown as element 132 in FIG. 2), starts sinking additional current, represented by a drop in the magnitude of $i_{Gm}$ (line 331). A negative current pulse, represented as line 333, is applied through the feed-forward capacitor (shown as capacitor $C_{FF}$ 124 of FIG. 2) in anticipation of that delay, which sinks charge from gates of a transistor circuit (shown as transistor 126 and transistor 128 in FIG. 2) before $i_{Gm}$ (shown as element 132 of FIG. 2) can increase. The change in current flowing through transistor 126 of FIG. 2 is proportional to the sum of current $i_{Gm}$ and current $i_{CFF}$ ($i_{Gm}+i_{CFF}$), represented by line 335, and cancels the effects of channel length modulation.

Figure 4:
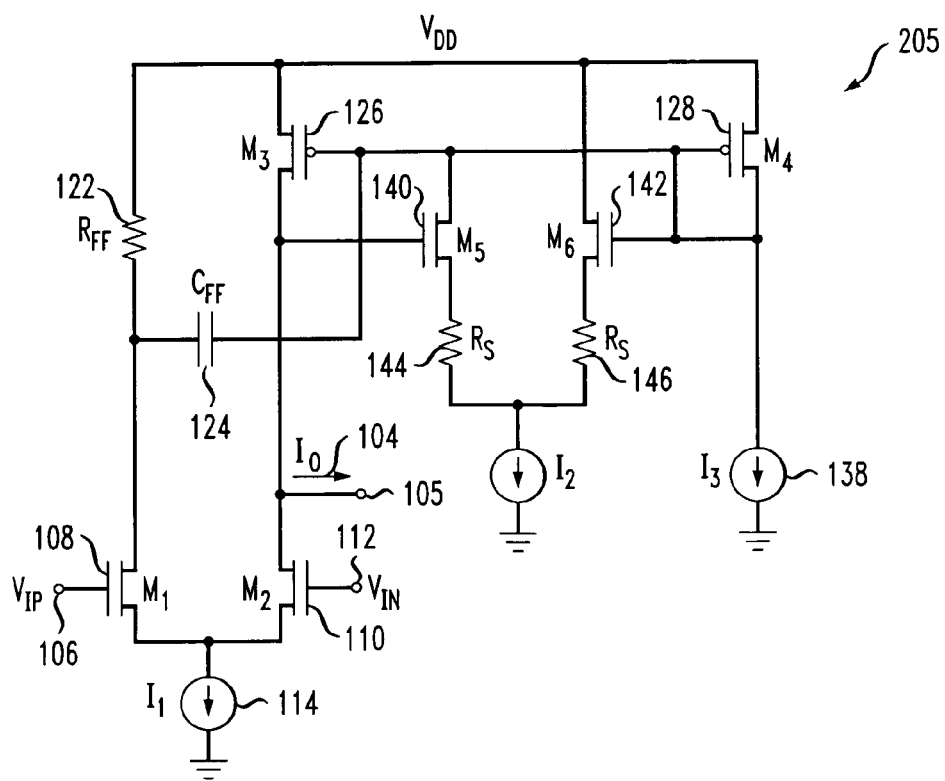
FIG. 4 shows a schematic diagram of one implementation of the LDD shown in FIG. 2.

FIG. 4 shows a schematic diagram 205 of one implementation of the LDD shown in FIG. 2. Specifically, FIG. 4 shows a differential pair transistor circuit, shown as transistor 140 and transistor 142, functioning as a transconductor. The value of transconductance quantity ($G_m$) is controlled by transistor sizing as well as source degeneration resistors 144 and 146. Gate voltage of transistor 128 is used as reference voltage ($V_{REF}$). An additional DC bias current 138 is used to set the minimum overdrive condition for transistor 126. More elaborate transconductor implementations are possible, but a single-stage differential pair, as shown, minimizes delay time. FIG. 4 also shows input voltage sources 106, 112, transistors 108, 110, tail current source 114, output current 104, output node 105 and feed-forward circuit elements 122, 124.

The circuit 205 shown in FIG. 4 is capable of very high data rates and can accommodate a wide range of laser series resistance. The circuit 205 may be operated at data rates in excess of 20 gigabytes per second (Gb/s). The achievable data rates are only limited by the available semiconductor technologies. The described impedance compensation improves extinction ratio from a given power supply voltage and the feed-forward circuit enables high data rates.

Figure 5:
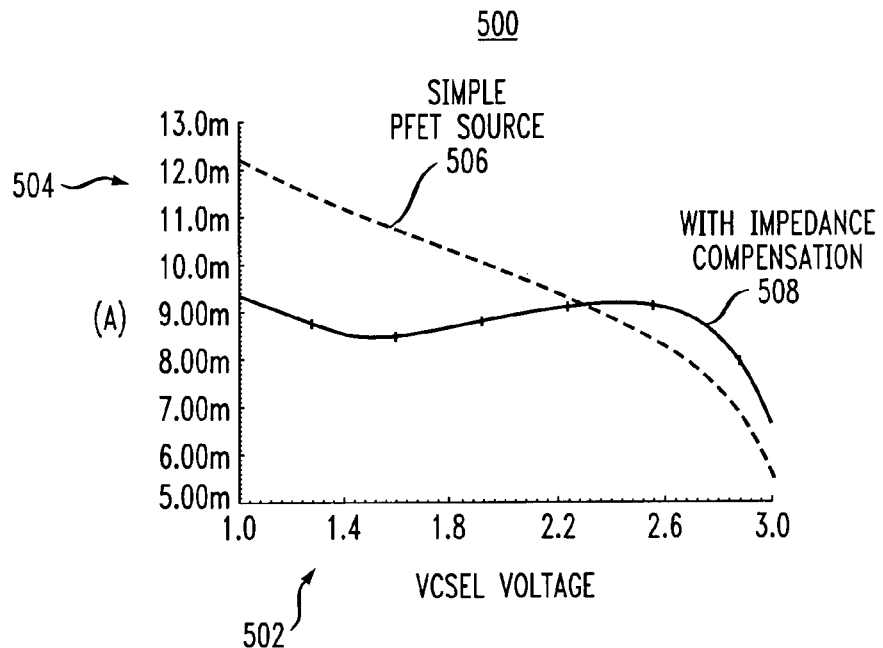
FIG. 5 shows simulated DC characteristics of an impedance compensated current source compared to a simple PFET current source.

FIG. 5 shows a graph 500 of simulated DC characteristics of an impedance compensated current source compared to a PFET current source. Graph 500 shows output voltage plotted on X-axis 502 and output current plotted on Y-axis 504. The characteristics of impedance compensated current source, solid line 508, are compared to characteristics of a simple PFET current source, dashed line 506. The improvement in the output impedance can be seen as flattening of the current curve of line 508. Indeed, the compensated source curve 508 has a slightly positive slope, which can be interpreted as a negative output impedance, which aids in laser modulation. The slope of line 508 can be tuned by adjusting transconductor gain $G_m$, described herein.

Figure 6:
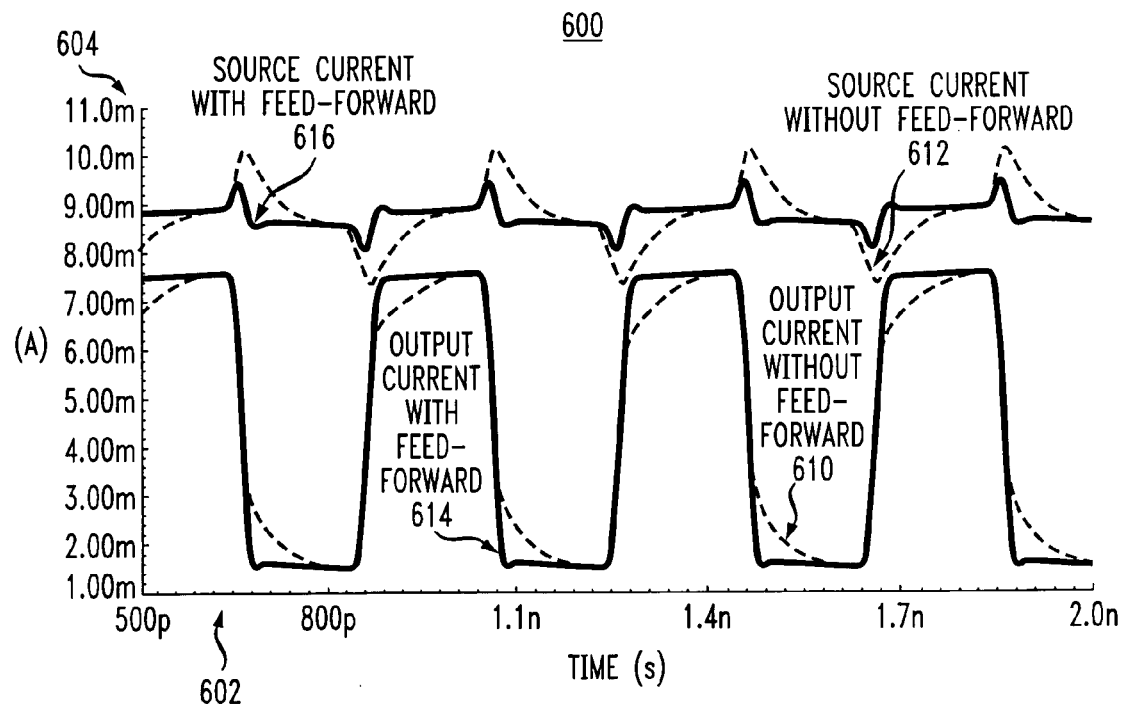
FIG. 6 shows a simulated source current and output current waveforms at 5 Gb/s.

FIG. 6 shows a graph 600 representing simulated source current (i.e., source current from transistor 126, of FIG. 2) and output current (shown as element 104 ($I_O$) in FIG. 2) at a rate of 5 Gb/s and demonstrates the effects of the feed-forward circuit. Time is plotted on X-axis 602 and current amplitude is plotted on Y-axis 604. Dashed line 610 represents the magnitude of the output current over time without the feed-forward circuit and dashed line 612 represents the magnitude of the source current without the feed-forward circuit. Solid line 614 represents the magnitude of the output current over time with the feed-forward circuit and solid line 616 represents the magnitude of the source current with the feed-forward circuit. Without the feed-forward circuit, the feedback loop needs about 200 ps (picoseconds) to adjust the output current after a transition. This delay can lead to significant ISI (inter-symbol interference) at data rates higher than 5 Gb/s in the specific semiconductor technology whose models were used for this simulation. Thus, FIG. 6 illustrates the advantage of the feed-forward circuit, since with the feed-forward circuit, the output current settles much faster. The advantages and performance of this circuit can easily scale with advances in the semiconductor technology.

II. Waveform Shaping

Principles of the present invention also provide apparatus and methods for pre-distorting laser modulation current to improve transition symmetry of optical waveforms, which may be applied to falling and rising transitions and can also be used for high frequency pre-emphasis in a variety of applications. The falling tail in the optical output power following a high-to-low transition can encroach on the timing window of the next bit, and cause undesired ISI. This asymmetrical behavior typically originates from the multi-transverse mode structure of devices such as, for example, VCSEL devices. When the laser is forward biased, dark regions with no light emission separate the lasing regions due to the presence of the transverse modes. When the laser is turned off, the charge from the dark regions, diffuses into the lasing regions and sustains photon emission for a brief time. The effects of this phenomenon can be reduced by increasing the average modulation current or by passing the received signal through a filter. The first method raises the average power causing laser heating and reduced extinction ratio. The second method increases receiver complexity.

Fall time compensation can be accomplished by introducing an undershoot current component on the falling edge of the modulating current. It is to be appreciated that fall time compensation is a specific example of waveform predistortion.

Figure 7:
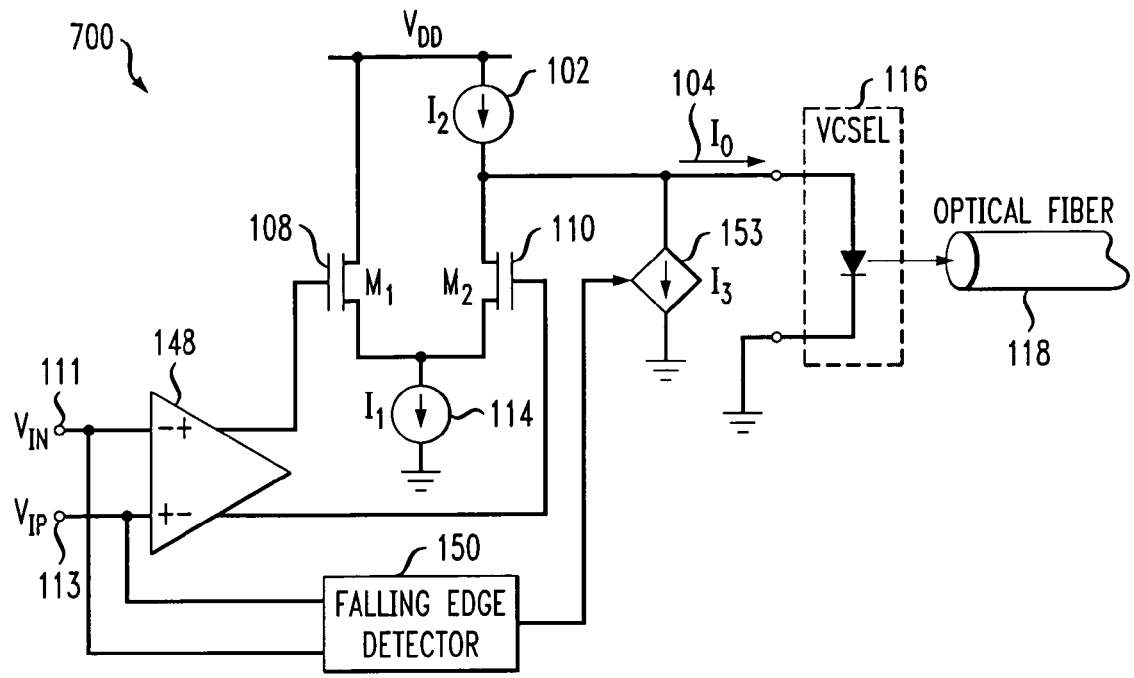
FIG. 7 shows a schematic diagram of an LDD with an edge detection circuit according to the present invention.

FIG. 7 shows a schematic diagram 700 of an LDD with a fall time compensation circuit. The basic LDD consists of a preamplifier 148 with voltage input nodes $V_{IN}$ 111 and $V_{IP}$ 113, which together constitute a differential input, that are used to drive an output stage, which includes transistors 108 and 110, tail current source 114, VCSEL 116 and optical fiber 118, current source 102 and output current 104.

To enable high-speed operation, the fall time compensation circuit uses a feed-forward approach. It consists of an edge detection circuit, shown in FIG. 7 as falling edge detector 150, which generates positive voltage pulses. The pulses are applied to a voltage controlled current source 153, which converts the positive voltage pulses to negative current pulses and sums them with the modulating current. The amplitude of the current pulses can be controlled by adjusting the transconductance of the voltage controlled current source 153. A more detailed description of the edge detection circuit 150 is provided below in relation to FIG. 8.

Figure 8:
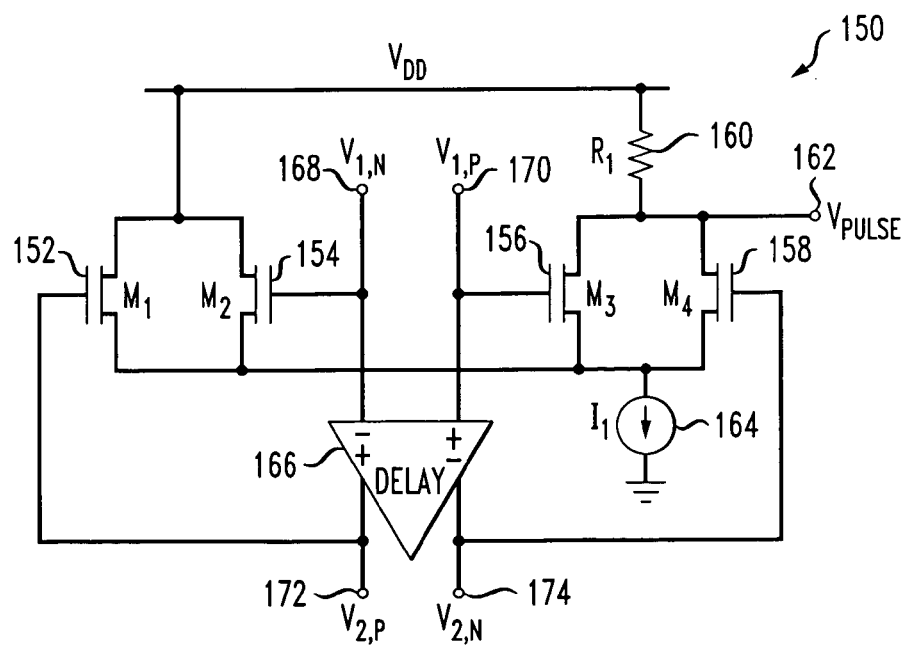
FIG. 8 shows a schematic diagram of the edge detection circuit shown in FIG. 7.

FIG. 8 shows a schematic diagram of the edge detection circuit 150 shown in FIG. 7, which is used to provide waveform shaping, such as pre-distortion. Edge detection circuit 150 is shown as a falling edge compensation circuit and includes a differential circuit consisting of four transistors 152, 154, 156 and 158 whose sources are connected to a tail current source 164 ($I_1$). A differential input signal (voltage) from nodes 168 and 170 ($V_1$) and a delayed differential input signal (voltage) from nodes 172 and 174 ($V_2$), via variable delay circuit 166, are applied to the gates of transistors 152, 154, 156 and 158. A single-ended output is taken from the drains of transistors 156 and 158. Because of the delay in the input signals ($V_1$, $V_2$), there is an interval of time following the $V_1$ transition during which gates of transistor 152 and transistor 154 see a high voltage while gates of transistor 156 and transistor 158 see a low voltage, or vice versa. During that time, a voltage pulse ($V_{pulse}$) is generated at output node 162. A negative pulse is generated for a low-to-high transition, and a positive pulse is generated for a high-to-low transition. The width of these pulses depends on the delay time, and can be adjusted by variable delay circuit 166.

Figure 9:
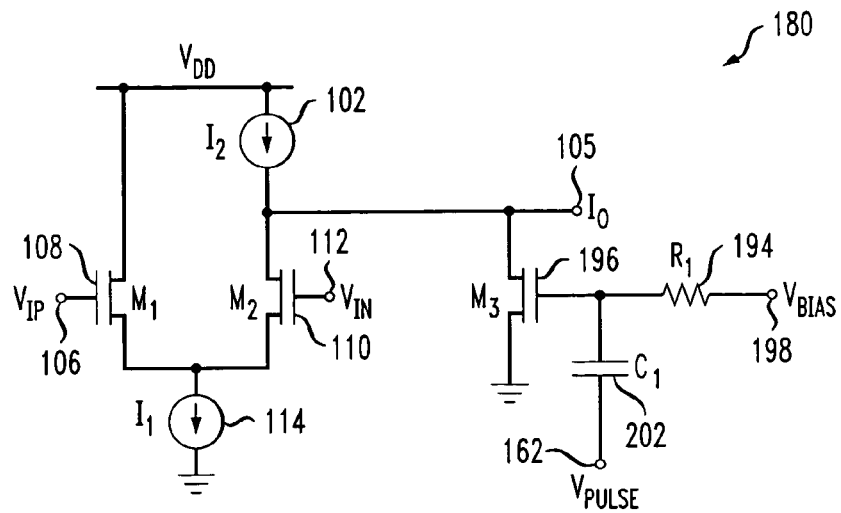
FIG. 9 shows a schematic diagram of an LDD circuit in which pulses from the edge detector circuit are rectified and mixed with an LDD output current according to the present invention.

FIG. 9 shows a schematic diagram of an LDD circuit 180 in which pulses from an edge detector circuit are rectified and mixed with an LDD output current. This circuit may be used to provide waveform shaping. The circuit 180 includes voltage inputs $V_{IP}$ 106 and $V_{IN}$ 112, transistors 108, 110 and transistor 196 whose drain is connected to output node 105 that provides output current ($I_O$). Transistor 196 is biased at a low DC current. Bias voltage ($V_{bias}$) at node 198 is applied to the gate of transistor 196 through resistor 194. The gate of transistor 196 carries no DC current, and there is no voltage drop across resistor 194. Voltage pulses from the edge detector (shown as element 150 in FIG. 8) are applied to the gate of transistor 196 via node 162 through capacitor 202. If a positive voltage pulse is applied, overdrive voltage of transistor 196 ($V_{GS}-V_T$) (overdrive voltage being discussed previously in relation to FIG. 2) increases, and a negative current pulse is created. The pulse sums with the modulation current (current 102 minus drain current of transistor 110) and shunts charge from the output node 105.

If a negative voltage pulse is applied, transistor 196 drops below threshold and conducts no current. Thus, the mixing circuit 180 also acts as a half-wave rectifier, and only creates negative current pulses for high-to-low transitions.

Figure 10:
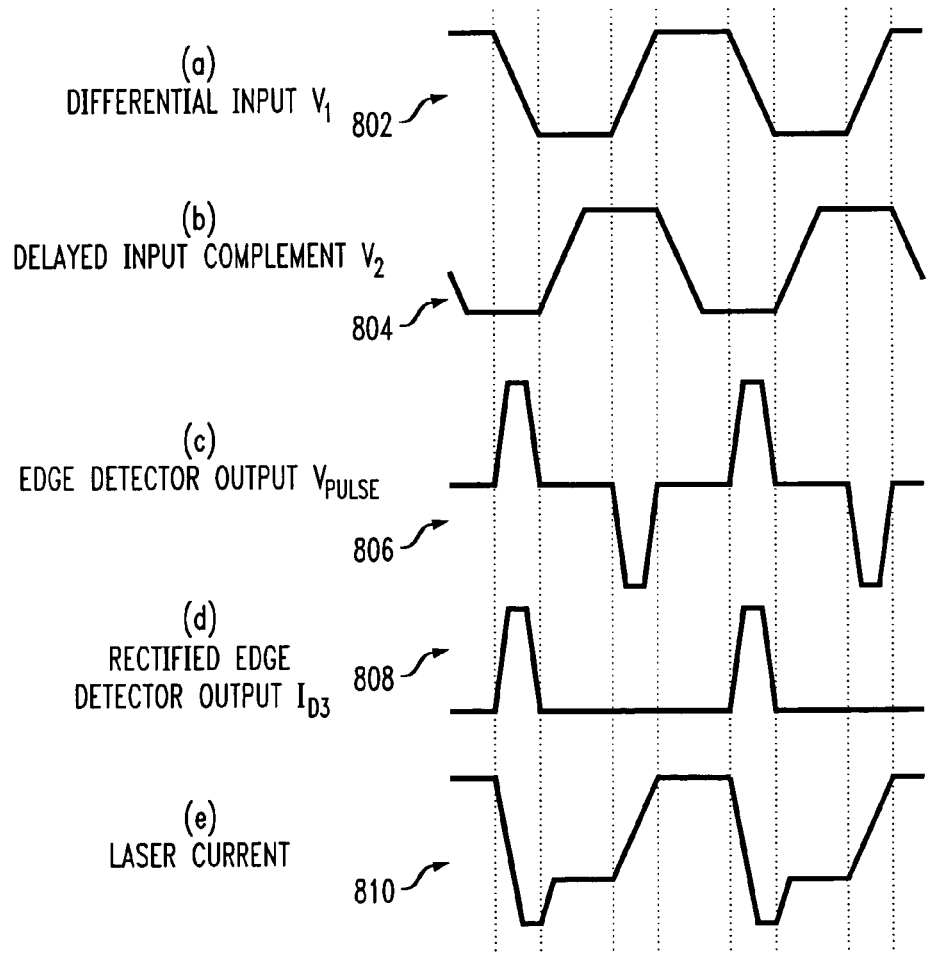
FIGS. 10(a) through (e) show selected time domain waveforms illustrating the operation of the LDD circuit shown in FIG. 9.

FIGS. 10(a) through (e) show selected time domain waveforms illustrating the operation of the LDD of FIG. 7. FIG. 10(a) shows line 802, which represents the time domain waveform of differential input ($V_1$ in FIG. 8). FIG. 10(b) shows line 804, which represents the time domain waveform of delayed input complement ($V_2$ in FIG. 8). The time domain waveform of the output of the edge detector is shown in FIG. 10(c), as line 806. The current shunted through the transistor (shown as element 196 in FIG. 9) (rectified edge detector output) is shown as line 808 in FIG. 10(d). FIG. 10(e), line 810, shows the combined laser modulation current (current 102 minus drain current of transistor 110 minus drain current of transistor 196 shown in FIG. 9) with an undershoot at the falling edge. The amplitude of the undershoot current can be adjusted by changing the channel dimensions or the bias conditions of a control transistor, such as transistor 196, shown in FIG. 9.

Figure 11:
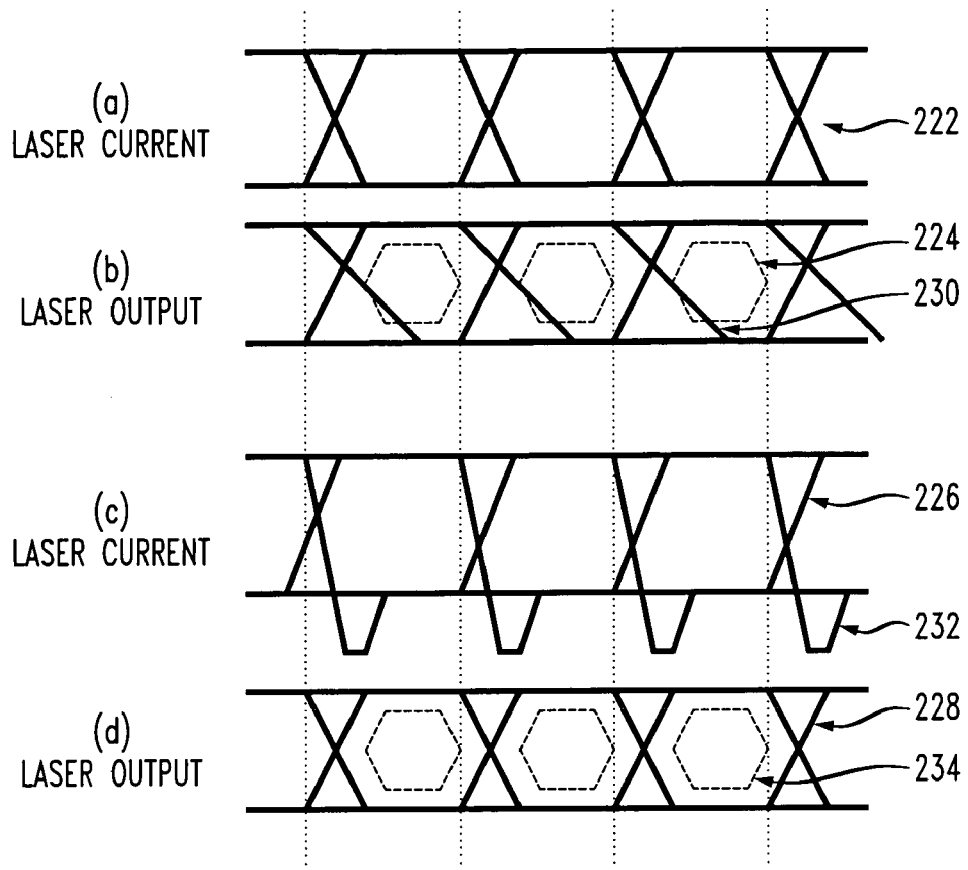
FIGS. 11(a) through (d) show a graphical comparison of uncompensated and compensated LDD waveforms and optical output of a laser.

FIGS. 11(a) through (d) show a graphical comparison of uncompensated and compensated LDD waveforms. FIGS. 11(a) and (b) show laser current and optical laser output, respectively of uncompensated waveforms. FIGS. 11(c) and (d) show laser current and optical laser output, respectively of compensated waveforms.

Waveforms in FIG. 11(a) show the modulating current 222 for an uncompensated LDD. FIG. 11(b) shows a laser light output eye diagram 224 for an uncompensated LDD. The tail of the falling edge 230 encroaches on the lower left corner of the eye mask in FIG. 11(b). The fall time compensation circuit solves this problem, as shown in FIG. 11(d), line 234. FIG. 11(c) shows a representation of a laser current, shown by line 226, compensated with a current undershoot, shown by line 232. The circuit described above may be implemented, for example, in CMOS 8sf technology and transmit at data rates up to 20 Gb/s.

Figure 12:
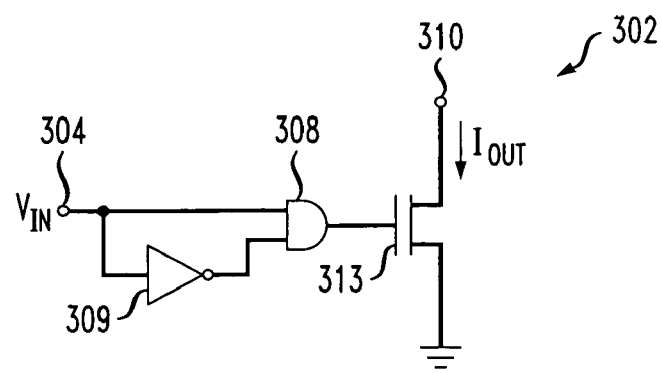
FIG. 12 shows a schematic diagram of an exemplary transition detector circuit according to the present invention.

FIG. 12 shows an example of another transition detection circuit. Circuit 302 shows one way to generate a pulse at a transition using an AND logic gate 308 with one of its inputs delayed by a fraction of the period, using an inverting delay circuit 309. Input node 304, transistor 313 and output current 310 are also shown in FIG. 12.

FIGS. 13(a) through (d) show transition detector waveforms, representing a pulse proportional to the delay, described in relation to FIG. 12. In FIG. 13(a), line 316 shows the input waveform. FIG. 13(b), line 318, shows a delayed input complement waveform. FIG. 13(c), line 320, shows an edge detector output current waveform. FIG. 13(d), line 322, shows a laser current waveform.

Figure 13:
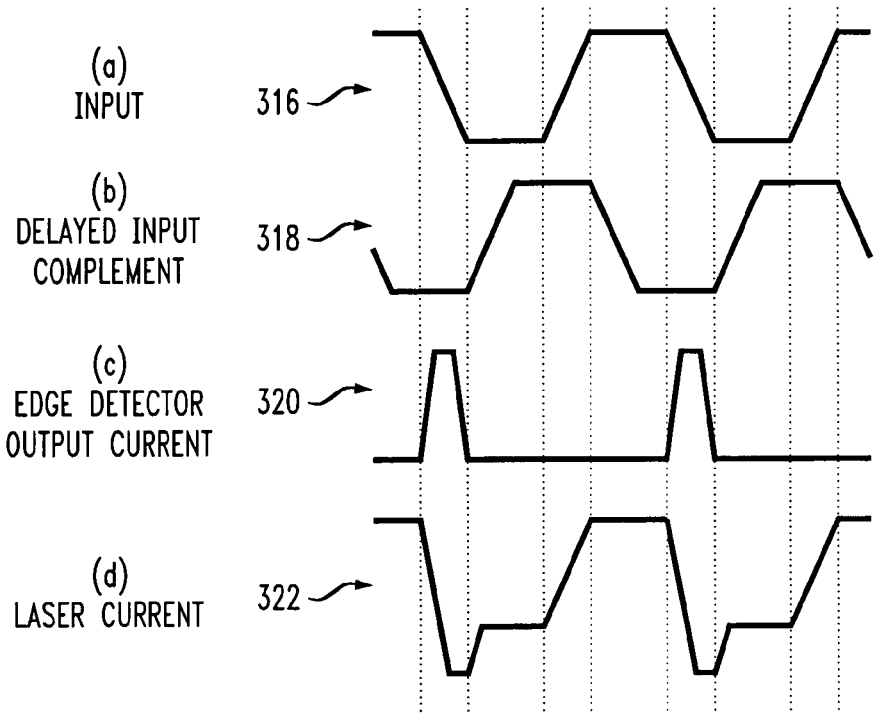
FIGS. 13(a) through (d) show examples of transition detector waveforms and LDD waveforms according to the present invention.
Figure 14:
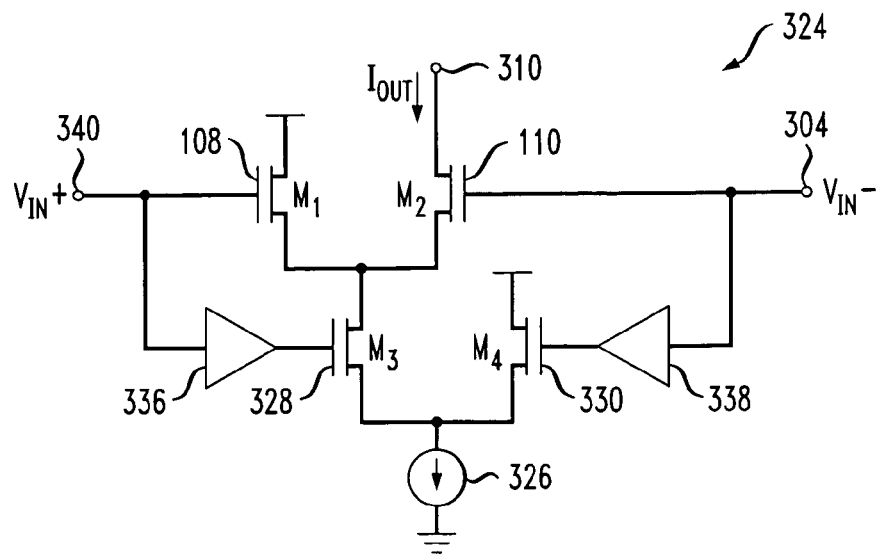
FIG. 14 shows a schematic diagram of a current mode logic (CML) implementation of the transition detector circuit shown in FIG. 12.

FIG. 14 shows a circuit 324 for implementing the transition detection function, as described in relation to FIG. 12 and FIG. 13, at high speed with a current mode logic (CML) AND gate. The circuit 324 includes input voltage nodes 304 and 340, a first transistor circuit, which includes transistors 108 and 110, and a second transistor circuit, which includes transistors 328 and 330. The transistor circuits are shown as stacked differential pairs. Delay buffers 336 and 338 are coupled to transistors 328 and 330, respectively. Tail current 326 is used for the undershoot function described herein. Current 310 (Io) provides pre-distortion, which is summed with the modulation current, as described herein.

Figure 15:
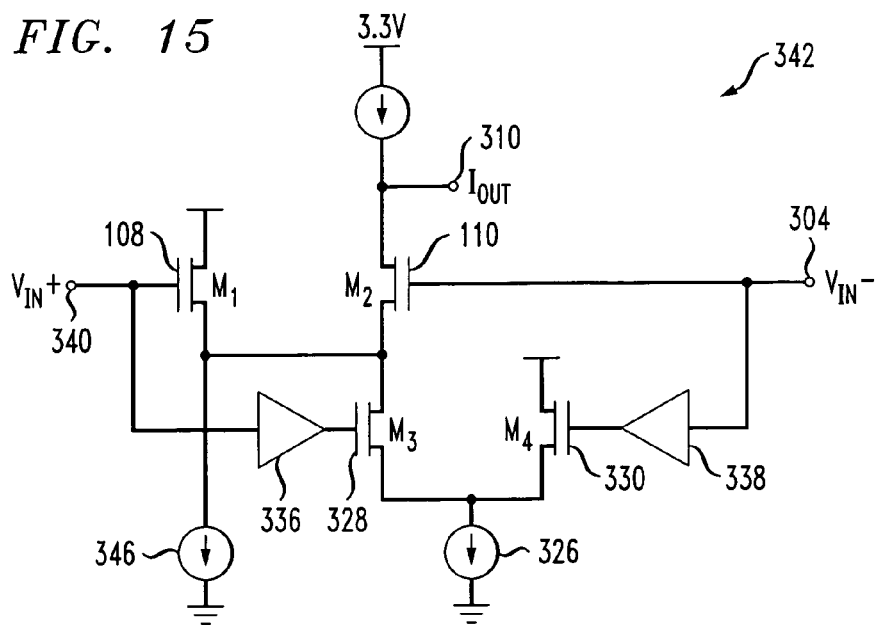
FIG. 15 shows a schematic diagram of an LDD circuit with an integral fall time compensation circuit according to the present invention.

FIG. 15 shows a circuit 342 that includes a laser diode driver with an integral fall time compensation circuit. The circuit 342 is an exemplary way to implement a TCA with fall time compensation. The circuit 342 delays and levelshifts inputs 304 and 340 ($V_{IN-}$ and $V_{IN+}$) with a pair of buffers, 336 and 338 and increases the effective tail current of a transistor circuit, which includes transistors 108 and 110, during falling transitions The effective tail current is the sum of the constant tail current 346 and a variable tail current which is the current flowing through transistor 328. This produces an undershoot in the modulation current, which speeds up discharge of node 310, which may be coupled to a load, for example a VCSEL, but is too short to disrupt average bias conditions (for example, VCSEL bias conditions) or cause the load voltage to fall below the lasing threshold. Since the fall time compensation (FTC) circuit is driven by the same signal as the modulating current switch (transistor circuit 108/110), time alignment of the undershoot pulse with the output current remains stable, and the relative timing jitter is low. The amplitude of the undershoot current can be controlled with the tail current 326 of a transistor circuit that includes transistors 328 and 330, and its duration can be controlled by adjusting the time constant at the gates of transistor 328 and 330.

Figure 16:
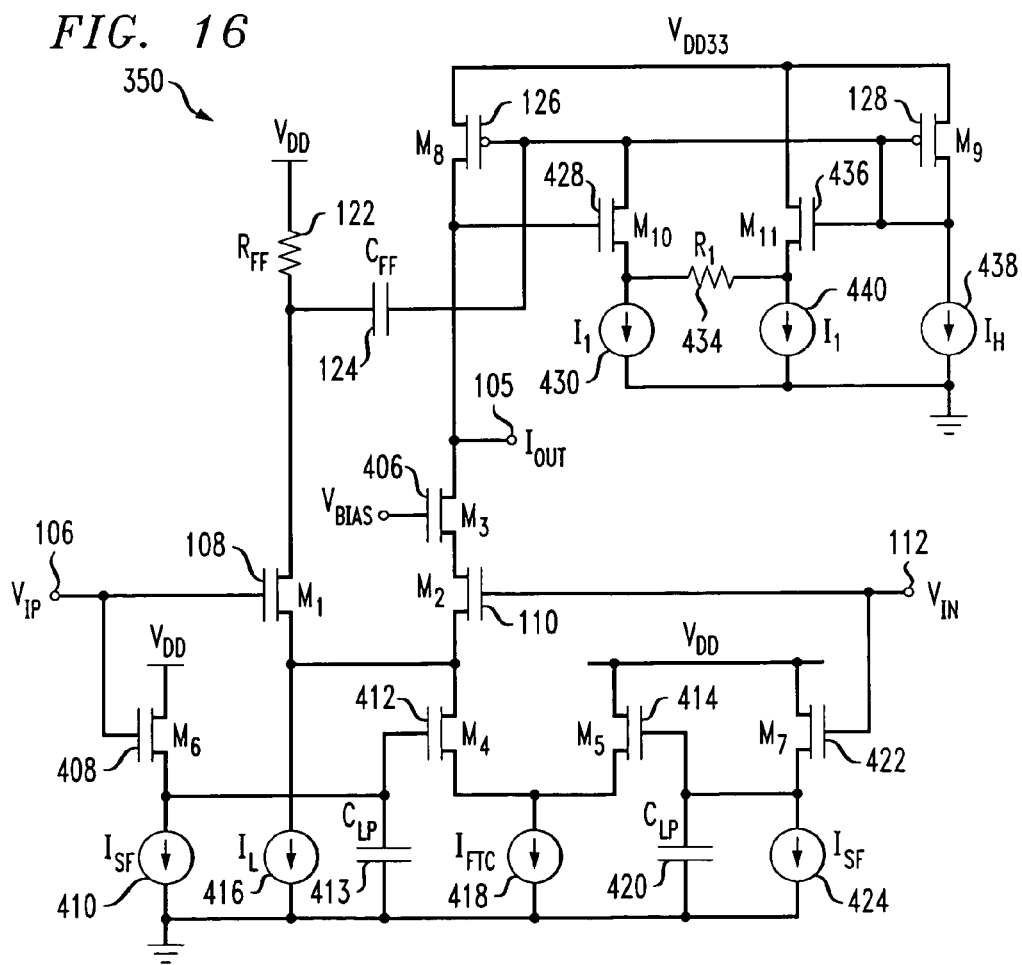
FIG. 16 shows a schematic diagram of a TCA amplifier-based LDD circuit combining impedance control aspects and pre-distortion aspects.

FIG. 16 shows a schematic diagram of a TCA amplifier-based LDD circuit 350 combining impedance control aspects and pre-distortion aspects of the invention.

Impedance control portions of circuit 350 include: voltage inputs 106, 112; a current mirror circuit, which includes transistors 126 and 128; a modulation circuit, which includes transistor 110, which may be part of a transistor circuit that includes transistor 108; a feed-forward circuit, which includes resistor 122 and capacitor 124; and a feedback circuit, which includes transistors 428 and 436. Resistor 434 and current sources 430, 438 and 440 are also shown. A cascode transistor 406 can be included in some technologies to avoid device breakdown due to excessive voltage, and is coupled to output node 105.

Circuit 350 also includes a pre-distorting laser modulation portion that improves transition symmetry features. These features include a first buffer circuit, which includes transistor 408 and current source 410 and a second buffer circuit, which includes transistor 422 and current source 424. Delay capacitors 413 and 420 as well as transistors 412 and 414 are shown. Transistor 412 provides a variable tail current component for the modulation circuit. The amplitude of the variable tail current available during signal transitions is determined by the constant current source 418. The circuit also includes current source 416.

Figure 17:
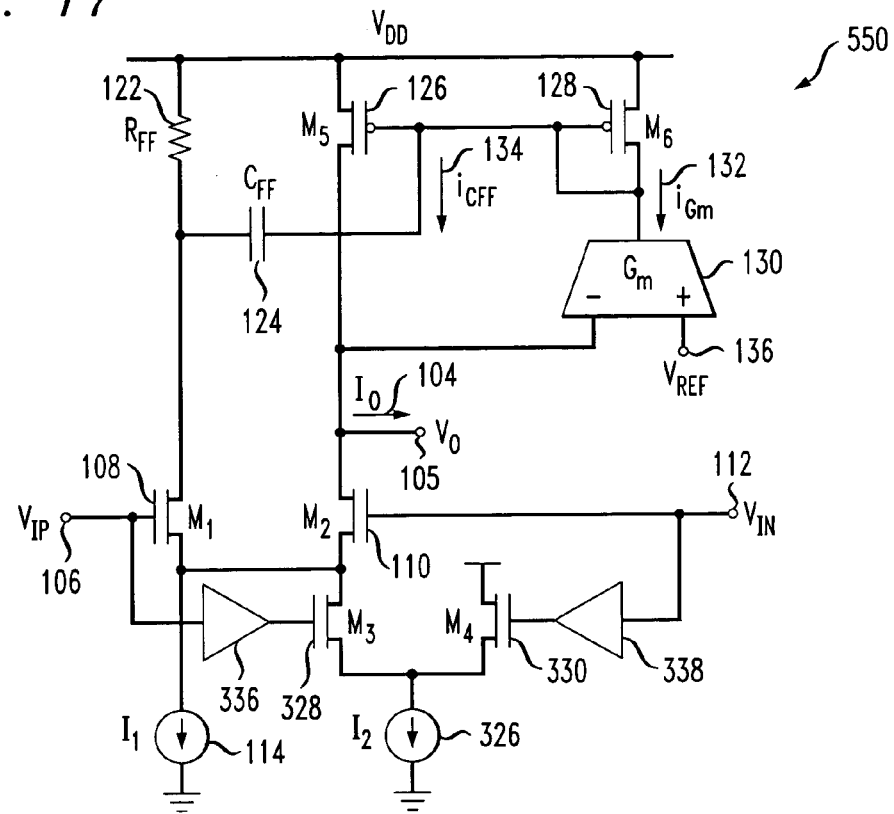
FIG. 17 shows a schematic diagram of an LDD circuit that combines impedance control aspects and pre-distortion aspects.

FIG. 17 shows a schematic diagram 550 of an LDD circuit that combines impedance control aspects and pre-distortion aspects of the invention. The elements have been previously described herein, thus only a brief overview is provided in relation to FIG. 17. The impedance control features include feedback circuit, shown as transconductor element 130, current mirror shown as transistors 126 and 128 and feed-forward circuit, including resistor 122 and capacitor 124. The pre-distortion features include modulation circuit 110, which is coupled to transistor 108, delay buffers 336 and 338 and transistors 328 and 330. Current 114 is the constant tail current component for transistors 108 and 110 and the variable tail current component is provided by transistor 328 during transitions. The other elements include input voltage nodes 106, 112, transconductor current 132, reference voltage node 136, output node 105, output current 104 and current source 326.

Figure 18:
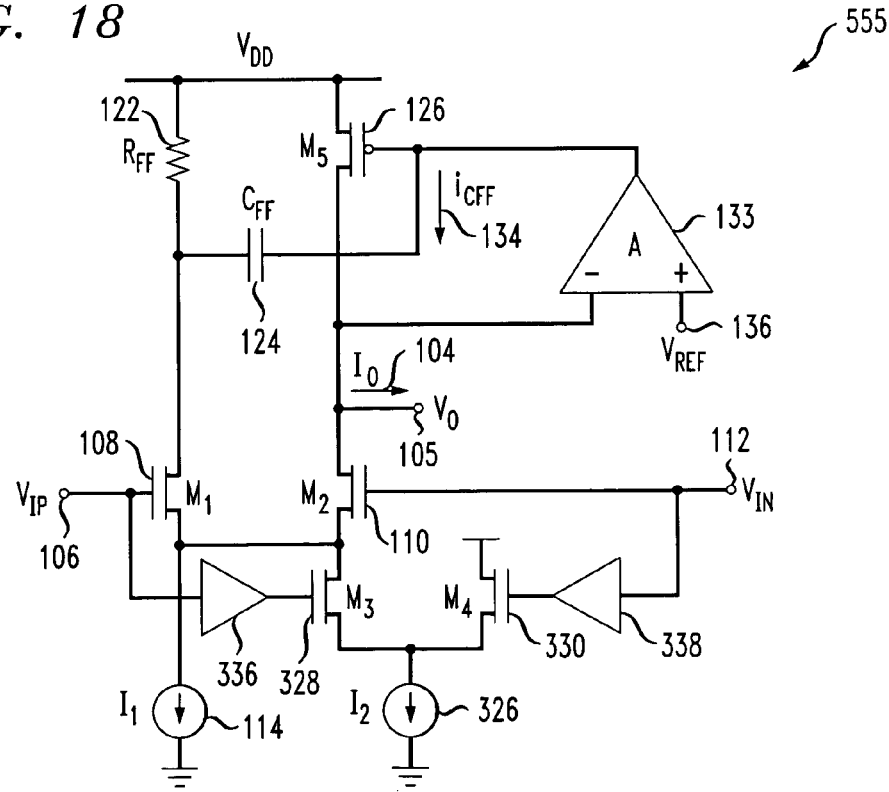
FIG. 18 shows a simplified schematic diagram of an LDD circuit that combines impedance control aspects and pre-distortion aspects, which is equivalent to circuit of FIG. 17.

FIG. 18 shows a more simplified embodiment of the LDD shown in FIG. 17. The LDD circuit 555, shown in FIG. 18, combines impedance control aspects and pre-distortion aspects. Circuit 555 is similar to circuit 550, shown in FIG. 17 except that amplifier 133 replaces transconductor 130 and transistor 128 shown in FIG. 17. The other elements of FIG. 18 have been discussed in relation to FIG. 17 and are not repeated.

It is to be understood that these and other embodiments and variations shown and described in the examples set forth above and the figures herein are merely illustrative of the principles of this invention and that various modifications may be implemented by those skilled in the art without departing from the scope and spirit of the invention.

What is claimed is:

1. An apparatus for providing a modulation current to an output node, as a function of a current provided by a current source, comprising:
   a feedback circuit adapted to generate a control signal for the current source based on a voltage differential;
   a modulating circuit, coupled to the feedback circuit, adapted to generate a modulation current; and
   a feed-forward circuit, coupled to the modulating circuit, adapted to precondition operation of a control node of the current source, as a function of at least part of the modulation current.

2. The apparatus of claim 1, wherein the feedback circuit provides impedance compensation for an output impedance of the current source.

3. The apparatus of claim 1, wherein the modulating circuit is a differential circuit.

4. The apparatus of claim 1, wherein the load comprises one or more of a laser, a light emitting diode, an electro-absorption modulating element and a resistive element.

5. The apparatus of claim 1, wherein a magnitude of the modulation current alternates between multiple levels representing multiple bits.

6. The apparatus of claim 1, wherein the current source is a low voltage current source.

7. The apparatus of claim 1, wherein the current source comprises one or more transistors.

8. The apparatus of claim 1, wherein the feed-forward circuit utilizes the modulation current.

9. The apparatus of claim 1, wherein the apparatus is a laser diode driver.

10. The apparatus of claim 1, wherein the apparatus is a transconductance amplifier.

11. The apparatus of claim 1, wherein the feedback circuit includes a transconductor element or an amplifier element.

12. The apparatus of claim 1, wherein the feed-forward circuit further comprises a resistive element and a capacitive element, coupled to the feedback circuit, the resistive and capacitive elements adapted to adjust the amplitude and duration of a feed-forward pulse.

13. The apparatus of claim 1, wherein the feed-forward circuit generates a pulse that precedes a signal generated by the feedback circuit.

14. A method for providing a modulation current to an output node, as a function of a current provided by a current source, comprising the steps of:
   generating a control signal for the current source based on a voltage differential, wherein the current source is a feedback-controlled current source;
   modulating an output current;
   preconditioning operation of a control node of the current source; and
   providing modulation current to a load, as a function of the current through the current source.

15. The method of claim 14, wherein the step of generating a control signal includes generating impedance compensation for an output impedance of the current source.

16. The method of claim 14, wherein the load comprises one or more of a laser, a light emitting diode, an electro-absorption modulating element and a resistive element.

17. The method of claim 14, further comprising modulating a laser by alternating a magnitude of the modulation current between multiple levels representing multiple bits.

18. The method of claim 14, further comprising utilizing a portion of the modulation current to precondition the operation of the control node of the current source.

19. The method of claim 14, wherein the preconditioning step transmits a pulse to the control node.

20. An apparatus for modulating a waveform, the apparatus having a signal source and an output node, comprising:
a modulating circuit adapted to receive input signals and provide modulated output signals; and
an edge detection circuit, coupled to the modulating circuit, the edge detection circuit adapted to sense a transition in the waveform, generate a signal to shape the waveform, and provide the waveform-shaping signal to the output node via a variable tail current of the modulating circuit.

21. The apparatus of claim 20, wherein the output node is coupled to one or more of a laser, a light emitting diode, an electro-absorption modulating element and a resistive element.

22. The apparatus of claim 20, wherein the signal to shape the waveform has a first amplitude when a low to high transition in the waveform is detected and the signal to shape the waveform has a second amplitude when a high to low transition in the waveform is detected.

23. The apparatus of claim 20, wherein the edge detection circuit generates an undershoot current at the transition in the waveform.

24. The apparatus of claim 23, wherein the edge detection circuit adjusts an amplitude of the undershoot current as a function of a load.

25. The apparatus of claim 20, wherein the edge detection circuit generates an overshoot current at the transition in the waveform.

26. The apparatus of claim 25, wherein the edge detection circuit adjusts an amplitude of the overshoot current as a function of a load.

27. The apparatus of claim 20, wherein the edge detection circuit includes a current mode logic circuit.

28. A method for modulating a waveform of input signals, comprising:
generating modulated output signals, as a function of input signals, in accordance with a modulating circuit;
sensing a transition in the waveform and generating a signal to shape the waveform; and
providing the waveform-shaping signal to an output node via a variable tail current of the modulating circuit.

29. The method of claim 28, wherein the signal has a first amplitude when a low to high transition in the waveform is detected and the signal has a second amplitude when a high to low transition in the waveform is detected.

30. The method of claim 28, further comprising generating an undershoot current at the sensed transition in the waveform.

31. The method of claim 30, further comprising adjusting an amplitude of the undershoot current as a function of a load.

32. The method of claim 28, further comprising generating an overshoot current at the sensed transition in the waveform.

33. The method of claim 32, further comprising adjusting an amplitude of the overshoot current as a function of a load.

34. An apparatus for modulating a waveform, comprising:
a variable tail current source for providing a variable tail current;
a modulating circuit, coupled to the variable tail current source, for receiving the variable tail current, the modulating circuit applying the modulated variable tail current to an output current,
wherein the magnitude of the variable tail current changes in response to a transition in the waveform.

35. A method for modulating a waveform, comprising:
generating a variable tail current;
modulating the variable tail current; and
applying the variable current to an output current, such that the magnitude of the modulated variable tail current changes in response to a transition in the waveform.

36. An apparatus for providing a modulation current to a load comprising:
a feedback circuit adapted to generate a control voltage for a current source based on a voltage differential;
a modulating circuit, coupled to the feedback circuit, the modulating circuit adapted to modulate an output current;
a feed-forward circuit, coupled to the modulating circuit, the feed-forward circuit adapted to precondition operation of a control node of the current source;
an edge detection circuit, coupled to the modulating circuit, the edge detection circuit adapted to sense a transition and generate a signal to shape the waveform; and
an output node, coupled to the feedback circuit, the output node adapted to provide a shaped waveform to a load.

37. The apparatus of claim 36, wherein the feedback circuit provides impedance compensation for an output impedance of the current source.

38. The apparatus of claim 36, wherein the modulating circuit is a differential circuit.

39. The apparatus of claim 36, wherein the current source is a low voltage current source.

40. The apparatus of claim 36, wherein the current source comprises one or more transistors.

41. The apparatus of claim 36, wherein the feed-forward circuit utilizes current from the modulating circuit.

42. The apparatus of claim 36, wherein the feedback circuit includes a transconductor element.

43. A method for providing a shaped waveform to a load, comprising:
generating a control voltage based on a voltage differential;
modulating an output current;
preconditioning operation of a control node of a current source, wherein the current source is a feedback-controlled current source;
sensing a transition in a waveform and generating a signal to shape the waveform; and
providing the shaped waveform to a load.

44. The method of claim 43, further comprising providing impedance compensation for an output impedance of a current source.

* * * * *